(12) United States Patent
Chang et al.

(10) Patent No.: US 9,286,974 B2
(45) Date of Patent: Mar. 15, 2016

(54) MEMORY DEVICES

(71) Applicant: TAIWAN SEMICONDUCTOR MANUFACTURING CO., LTD., Hsinchu (TW)

(72) Inventors: Chih-Yang Chang, Changhua County (TW); Chia-Fu Lee, Hsinchu (TW); Wen-Ting Chu, Kaohsiung (TW); Yue-Der Chih, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/061,539

(22) Filed: Oct. 23, 2013

(65) Prior Publication Data

US 2015/0109850 A1 Apr. 23, 2015

(51) Int. Cl.
*G11C 13/00* (2006.01)
*H01L 45/00* (2006.01)

(52) U.S. Cl.
CPC ........ *G11C 13/0026* (2013.01); *G11C 13/0069* (2013.01); *H01L 45/16* (2013.01); *G11C 13/0007* (2013.01); *G11C 2013/0073* (2013.01); *G11C 2213/79* (2013.01)

(58) Field of Classification Search
None
See application file for complete search history.

(56) References Cited

U.S. PATENT DOCUMENTS

| | | | |
|---|---|---|---|
| 6,801,448 B2 | 10/2004 | Hsu | |
| 6,849,891 B1 | 2/2005 | Hsu et al. | |
| 6,995,999 B2 * | 2/2006 | Morimoto | 365/148 |
| 7,407,858 B2 | 8/2008 | Li et al. | |
| 7,795,606 B2 | 9/2010 | Jin et al. | |
| 8,000,128 B2 | 8/2011 | Li et al. | |
| 8,009,454 B2 | 8/2011 | Lee et al. | |
| 2004/0012995 A1 * | 1/2004 | Ishikawa | 365/158 |
| 2013/0235649 A1 * | 9/2013 | Lindstadt | G11C 13/0035 365/148 |

* cited by examiner

*Primary Examiner* — James G Norman
(74) *Attorney, Agent, or Firm* — McDermott Will & Emery LLP

(57) ABSTRACT

A device is disclosed that includes an I/O memory block. The I/O memory block includes memory cells, bit lines and a source line. The number of the formed bit lines is at least 4. The bit lines and the source line are electrically connected to the memory cells. In the I/O memory block, the source line and the bit lines are configured to provide logical data to the memory cells.

16 Claims, 5 Drawing Sheets

MEMORY DEVICES

BACKGROUND

Memory devices have been widely used in electronic products to provide high storage speed and low power consumption. For example, resistive random access memory (RRAM) device is one possible candidate for next generation non-volatile memory technology due to simple and complementary metal-oxide semiconductor (CMOS) logic compatible process. Each memory cell in a RRAM device is a metal oxide material sandwiched between top and bottom electrodes. By applying appropriate voltage, the state of each memory cell can be changed from high resistance state (HRS) to low resistance state (LRS) or from LRS to HRS. The above switching mechanism is related to oxygen vacancy migration. The low and high resistance states are utilized to indicate a logical data "1" or "0", thereby allowing for data storage.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and is not meant to limit the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
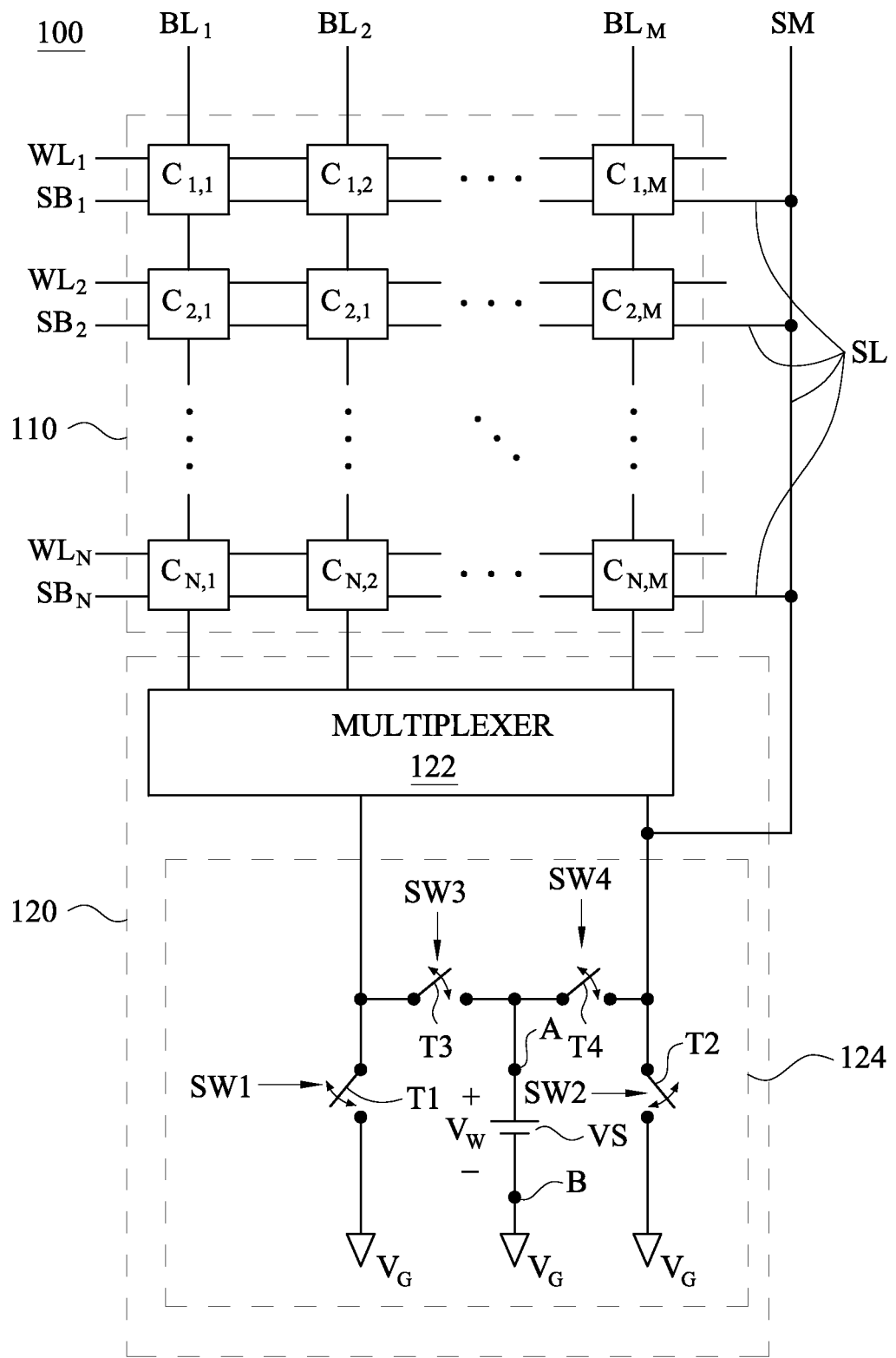
FIG. 1 is a schematic diagram of a memory device in accordance with various embodiments of the present disclosure.

FIG. 1 is a schematic diagram of a memory device 100 in accordance with various embodiments of the present disclosure. In some embodiments, the memory device 100 is a resistive random access memory (RRAM, or ReRAM) device, dynamic random access memory (DRAM) device, static random access memory (SRAM) device, or the like. The memory device 100 includes an input/output (I/O) memory block 110 and a periphery circuit 120. The I/O memory block 110 includes memory cells $C_{1,1}$-$C_{N,M}$ arranged in a matrix formed by bit lines $BL_1$-$BL_M$ and word lines $WL_1$-$WL_N$. Each one of the memory cells $C_{1,1}$-$C_{N,M}$ is electrically connected by one of the bit lines $BL_1$-$BL_M$ and one of the word lines $WL_1$-$WL_N$. For illustration, a memory cell $C_{i,j}$ is electrically connected to a bit line $BL_j$ and a word line WU The memory cells $C_{1,1}$-$C_{N,M}$ are located at respective intersections of the bit lines $BL_1$-$BL_M$ and word lines $WL_1$-$WL_N$.

The source line SL is electrically connected to the memory cells $C_{1,1}$-$C_{N,M}$ and the periphery circuit 120. In detail, the source line SL has a main portion SM and branch portions $SB_1$-$SB_N$. The main portion SM is electrically connected to the periphery circuit 120. The branch portions $SB_1$-$SB_N$ are electrically connected to the memory cells $C_{1,1}$-$C_{N,M}$. For illustration, the branch portion $SB_1$ is electrically connected to the memory cells $C_{1,1}$-$C_{1,M}$, the branch portion $SB_2$ is electrically connected to the memory cells $C_{2,1}$-$C_{2,M}$, the branch portion $SB_3$ is electrically connected to the memory cells $C_{3,1}$-$C_{3,M}$, and so on. In some embodiments, a width of the main portion SM is greater than that of each of the branch portions $SB_1$-$SB_N$.

In some embodiments, the main portion SM of the source line SL is located outside the I/O memory block 110. In some embodiments, the main portion SM of the source line SL is located between two of the bit lines $BL_1$-$BL_M$.

In some embodiments, the periphery circuit 120 includes a multiplexer 122 and a switch group 124. The multiplexer 122 is electrically connected to the bit lines $BL_1 BL_M$ and configured to select one of the bit lines $BL_1$-$BL_M$. The switch group 124 is electrically connected to the multiplexer 122 and configured to allow a writing voltage $V_W$ and a ground voltage $V_G$ to be applied on the source line SL and a selected bit line. The switch group 124 includes switches T1-T4 and a voltage source VS. The voltage source VS is configured to provide the writing voltage $V_W$ for writing operations of the memory cells $C_{1,1}$-$C_{N,M}$ in the I/O memory block 110. The voltage source VS has two terminals A and B, and the voltage level of the terminal A is higher than that of the terminal B. With operations of the switches T1-T4, one of the selected bit line and the source line SL is electrically connected to the voltage source VS, and the other one of the selected bit line and the source line SL is grounded. Moreover, the operations of the switches T1-T4 are controlled by switching signals SW1-SW4, respectively.

In detail, the switch T1 is electrically connected to the multiplexer 122 to allow the ground voltage $V_G$ to be applied on the selected bit line in accordance with the switching signal SW1. The switch T2 is electrically connected to the source line SL to allow the ground voltage $V_G$ to be applied on the source line SL in accordance with the switching signal SW2. The switch T3 is electrically connected between the multiplexer 122 and the terminal A of the voltage source VS, and is configured to electrically connect the selected bit line to the voltage source VS in accordance with the switching signal SW3. The switch T4 is electrically connected between the source line SL and the terminal A of the voltage source VS, and is configured to electrically connect the source line SL to the voltage source VS in accordance with the switching signal SW4.

There are two transition states of the switch group 124. One transition state is defined as a setting state, where the writing voltage VW is input to the multiplexer 122 and the ground voltage VG is input to the source line SL. In the setting state, the switching signals SW1 and SW4 respectively control the switches T1 and T4 to turn off, and the switching signals SW2 and SW3 respectively control the to switches T2 and T3 to turn on. The other transition state is defined as a resetting state, where the ground voltage VG is input to the multiplexer 122 and the writing voltage VW is input to the source line SL. In the resetting state, the switching signals SW1 and SW4 respectively control the switches T1 and T4 to turn on, and the switching signals SW2 and SW3 respectively control the to switches T2 and T3 to turn off.

Figure 2A:
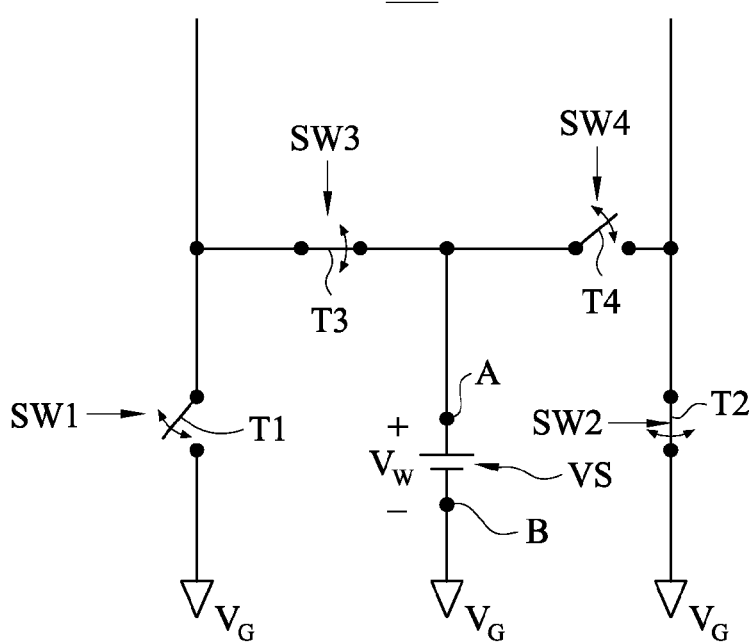
FIGS. 2A-2B show the setting and resetting state of the periphery circuit in FIG. 1 in accordance with various embodiments of the present disclosure.

FIG. 2A shows the setting state of the periphery circuit 120 in FIG. 1 in accordance with various embodiments of the present disclosure. When the switch group 124 switches to the setting state, the switches T1 and T4 are turned off, and the switches T2 and T3 are turned on, such that the voltage source VS is electrically connected to the selected bit line, and the source line SL is grounded.

Figure 2B:
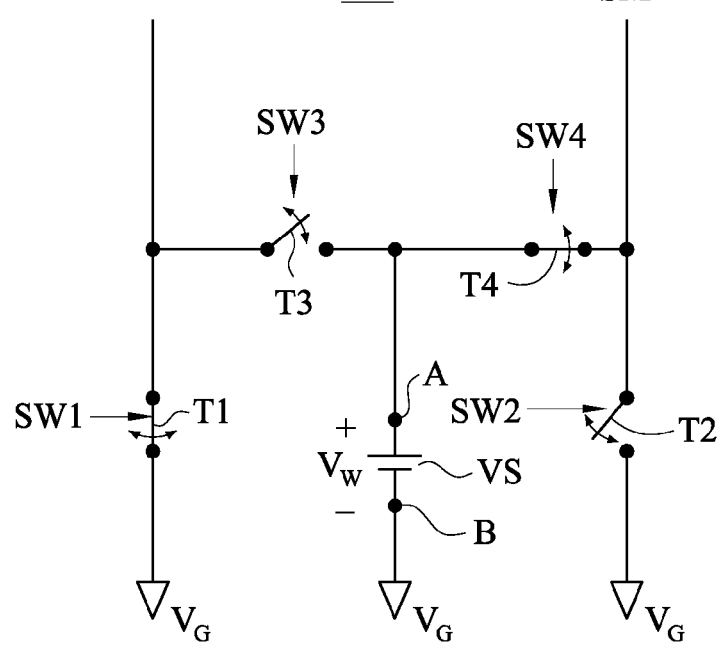

FIG. 2B shows the resetting state of the periphery circuit 120 in FIG. 1 in accordance with various embodiments of the present disclosure. When the switch group 124 switches to the resetting state, the switches T2 and T3 are turned off, and the switches T1 and T4 are turned on, such that the voltage source VS is electrically connected to the source line SL, and the selected bit line is grounded.

In the operation of writing logical data to a memory cell of the I/O memory block 110, the multiplexer 122 establishes connection between the switch group 124 and the bit line electrically connected to the memory cell. In such condition, the transition state of the switch group 124 switches to either the setting state as shown in FIG. 2A or the resetting state as shown in FIG. 2B.

Reference is made back to FIG. 1. For illustration, if the logical data "1" is selected to be written into the memory cell $C_{i,j}$ of the I/O memory block 110, the multiplexer 122 selects the bit line $BL_j$ to establish connection between the switch group 124 and the bit line $BL_j$, and the transition state of the switch group 124 switches to the setting state. The word line $WL_i$ is also applied with a voltage level which indicates writing logical data "0" to the memory cell $C_{i,j}$.

On the other hand, if the logical data "0" is selected to be written into the memory cell $C_{i,j}$ of the I/O memory block 110, the multiplexer 122 selects the bit line $BL_j$ to establish connection between the switch group 124 and the bit line $BL_j$, and the transition state of the switch group 124 switches to the resetting state. The word line $WL_i$ is also applied with a voltage level which indicates writing logical data "0" to the memory cell $C_{i,j}$.

Based on the aforementioned embodiments in FIG. 1, a single multiplexer is required for selecting a bit line from bit lines in an I/O memory block. Since one main portion of a source line is connected to all memory cells of the I/O memory block, no additional multiplexer is required in a periphery circuit, compared to other approaches using an additional multiplexer for selecting one main portion from multiple main portions of the source line. Hence, the circuit area and manufacture cost are significantly reduced.

Figure 3:
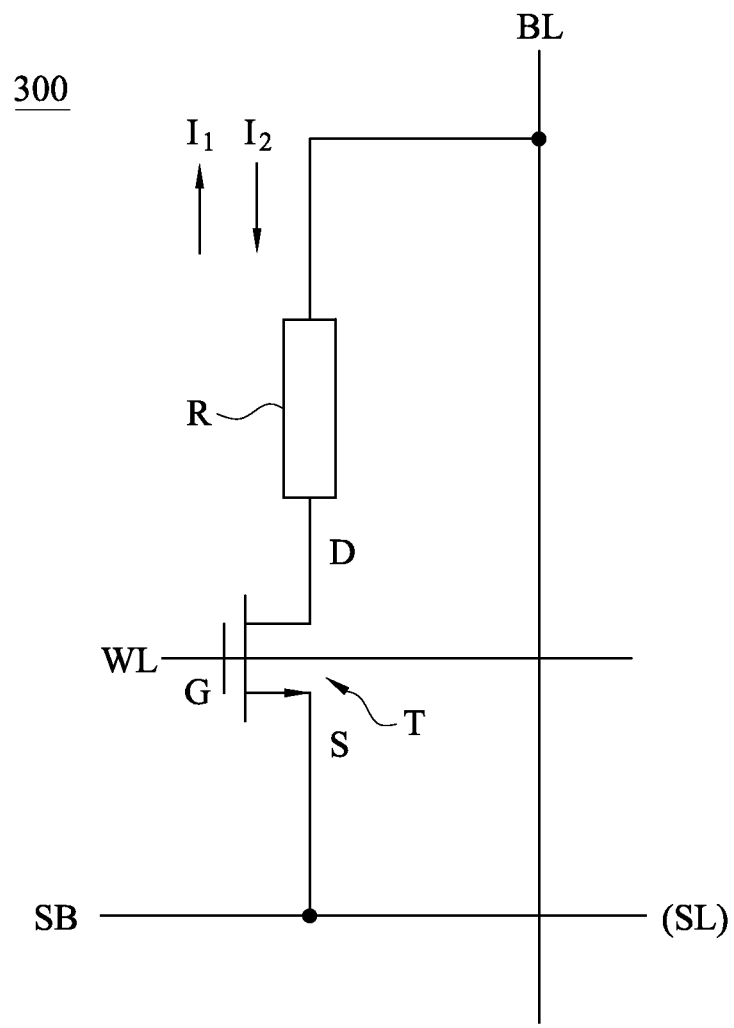
FIG. 3 is a circuit diagram of a memory cell in accordance with various embodiments of the present disclosure.

In some embodiments, the memory device 100 is a resistive random access memory (RRAM) device. FIG. 3 is a circuit diagram of a memory cell 300 according to various embodiments of the present disclosure. The memory cell 300 is configured as one of the memory cells $C_{1,1}$-$C_{N,M}$ in FIG. 1. For illustration, the memory cell 300 is a 1T1R RRAM memory cell, which includes a MOS transistor T and a resistive memory unit R. The drain D of the MOS transistor T is electrically connected to the resistive memory unit R. The gate G of the MOS transistor T is electrically connected to a word line WL, which is one of the word lines $WL_1$-$WL_N$ shown in FIG. 1. The source S of the MOS transistor T is electrically connected to the branch portion SB, which is one of the branch portions $SB_1$-$SB_N$ shown in FIG. 1. One terminal of the resistive memory unit R is electrically connected to the drain D of the MOS transistor T, and the other terminal of the resistive memory unit R is electrically connected to the bit line BL, which is one of the bit lines $BL_1$-$BL_M$ shown in FIG. 1.

The resistive memory unit R has two states. One is defined as low resistance state (LRS), and the other is defined as high resistance state (HRS). The LRS state represents that logical data "1" is written into the memory cell 300, and the HRS state represents that logical data "0" is written into the memory cell 300. The resistance of the resistive memory unit R in the HRS state is relatively higher than that in the LRS state. The state of the resistive memory unit R changes in accordance with the current I1 or I2 flowing therethrough. For illustration, the current I1 indicates the current flowing from the resistive memory unit R, and the current I2 indicates the current flowing toward the resistive memory unit R. The state of the resistive memory unit R changes to the LRS state when the current I1 flows through the resistive memory unit R. The state of the resistive memory unit R changes to the HRS state when the current I2 flows through the resistive memory unit R.

For illustration, if the memory cell 300 needs to be written with logical data "1" the voltage of the bit line BL changes to the writing voltage $V_W$, the voltage of the branch portion SB changes to the ground voltage $V_G$, and the voltage level of the word line WL changes to be higher than the writing voltage $V_W$. As a result, the MOS transistor T is conducted, and the current I1 flows through the MOS transistor T. Accordingly, the state of the resistive memory unit R is changed to the LRS state.

For another illustration, if the memory cell 300 needs to be written with logical data "0", the voltage of the bit line BL changes to the ground voltage $V_G$, the voltage of the branch portion SB changes to the writing voltage $V_W$, and the voltage level of the word line WL changes to be higher than the writing voltage $V_W$. As a result, the MOS transistor T is conducted, and the current I2 flows through the MOS transistor T. Accordingly, the state of the resistive memory unit R is changed to the HRS state.

Figure 4:
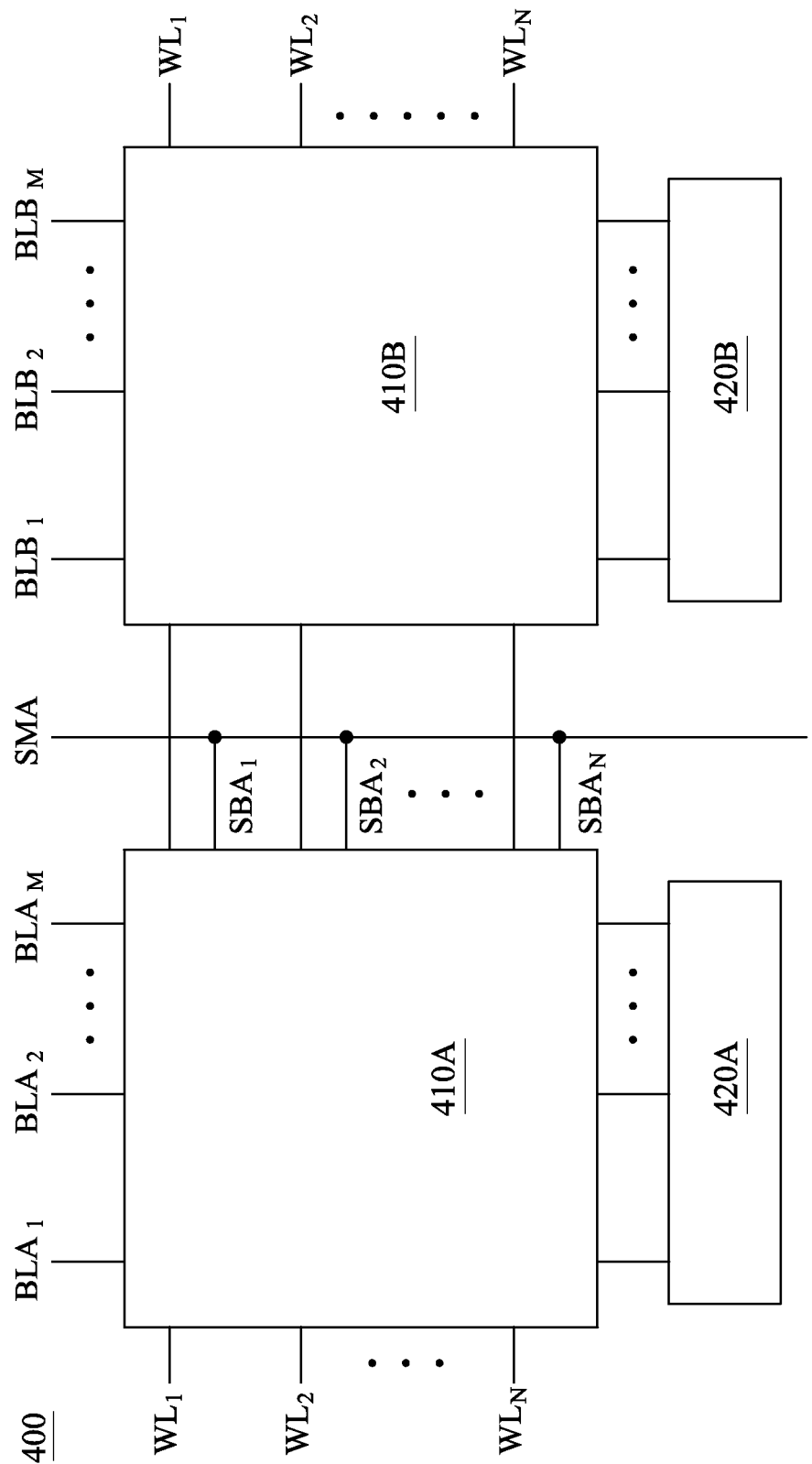
FIG. 4 is a schematic diagram of a memory device in accordance with various embodiments of the present disclosure.

In some embodiments, the memory device of the present disclosure includes multiple I/O memory blocks. Moreover, the source line for controlling the memory cells in an I/O memory block is disposed between two adjacent I/O memory blocks. FIG. 4 is a schematic diagram of a memory device 400 in accordance with various embodiments of the present disclosure. The memory device 400 includes I/O memory blocks 410A and 410B periphery circuits 420A and 420B. Memory cells (not labeled) of the I/O memory block 410A are controlled by the periphery circuit 420A, bit lines $BLA_1$-$BLA_M$, word lines $WL_1$-$WL_N$, and a source line including a main portion SMA and branch portions $SBA_1$-$SBA_N$. Memory cells (not labeled) of the I/O memory block 410B are controlled by the periphery circuit 420B, bit lines $BLB_1$-$BLB_M$, the word lines $WL_1$-$WL_n$ and another source line including a main portion and branch portions (not shown in FIG. 4). The word lines $WL_1$-$WL_N$ extend through the I/O memory blocks 410A and 410B to control the memory cells in the I/O memory blocks 410A and 410B. In some embodiments, the main portion SMA is located in a gap provided at one edge of the I/O memory block 410A. For illustration, the gap is formed between the I/O memory blocks 410A and 410B.

Figure 5:
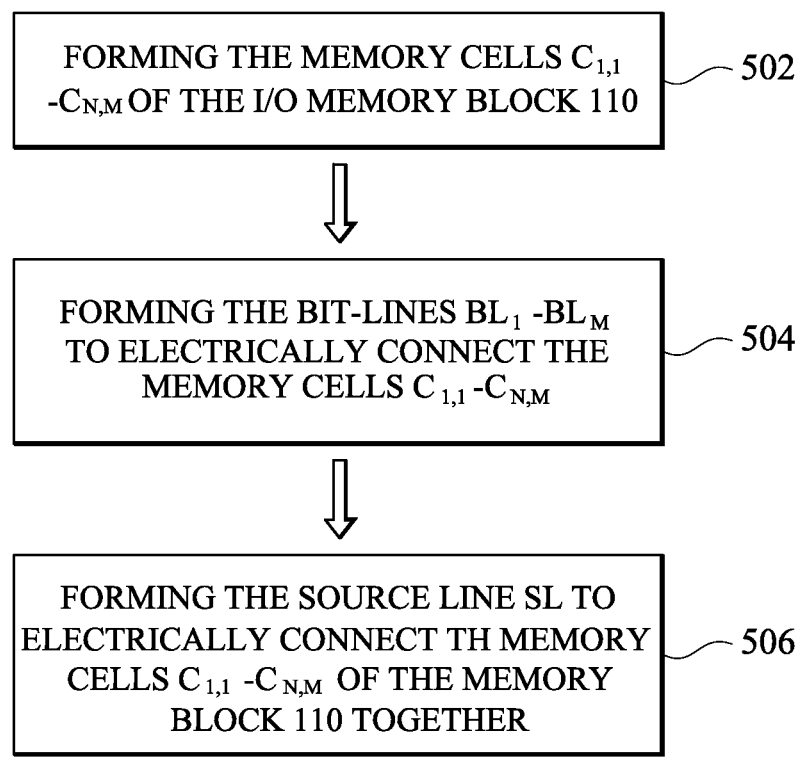
FIG. 5 is a flowchart showing a method for forming an I/O memory block in a memory device in accordance with various embodiments of the present disclosure.

FIG. 5 is a flowchart showing a method 500 for forming an I/O memory block in a memory device according to various embodiments of the present disclosure. The method 500 shown in FIG. 5 is applied for forming the memory device 100 shown in FIG. 1. For illustration, the operations of forming the memory device 100 in FIG. 1 are described below with reference to the method 500.

The method 500 begins at operation 502. In operation 502, the memory cells $C_{1,1}$-$C_{N,M}$ of the I/O memory block 110 are formed and arranged in a matrix. Operation 504 is performed after operation 502. In operation 504, the bit lines $BL_1$-$BL_M$ are formed to electrically connect the memory cells $C_{1,1}$-$C_{N,M}$. In some embodiments, the number of the bit lines $BL_1$-$BL_M$ is at least 4 (i.e., M is greater than or equal to 4). Operation 506 is performed after operation 504. In operation 506, the source line SL is formed to electrically connect the memory cells $C_{1,1}$-$C_{N,M}$ of the I/O memory block 110 together. The formed source line SL has the main portion SM and the branch portions SBN. The branch portions SBN are electrically connected to the memory cells $C_{1,1}$-$C_{N,M}$. In some embodiments, the branch portions SBN are parallel to rows of the matrix, and the main portion SM is parallel to columns of the matrix.

In accordance with some embodiments, the present disclosure discloses a device including an I/O memory block. The I/O memory block includes memory cells, bit lines and a source line. The number of the formed bit lines is at least 4. The bit lines and the source line are electrically connected to the memory cells. In the I/O memory block, the source line and the bit lines are configured to provide logical data to the memory cells.

In accordance with another embodiments, the present disclosure discloses a device including I/O memory blocks. A gap is provided at one edge of each of the I/O memory blocks. Each of the I/O memory blocks includes memory cells, bit lines and a source line. The number of the formed bit lines is at least 4. The bit lines and the source line are electrically connected to the memory cells. In each of the I/O memory blocks, the source line and the bit lines are configured to provide logical data to the memory cells. The source line has a main portion located in the gap and branch portions.

In accordance with yet another embodiments, the present disclosure discloses a method. In this method, memory cells of an I/O memory block are formed. Bit lines and a source line are formed to electrically connect the memory cells. The number of the formed bit lines is at least 4.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A device, comprising:
   an input/output (I/O) memory block comprising:
      a plurality of memory cells arranged in a matrix of a plurality of rows and a plurality of columns;
      at least four bit lines electrically connected to the plurality of memory cells and configured to provide logical data to the plurality of memory cells; and
      a source line connected to the plurality of memory cells and configured to provide logical data to the plurality of memory cells, the source line having:
         a main portion; and
         a plurality of branch portions connected to the main portion, each of the plurality of branch portions being electrically connected to the memory cells in one of the plurality of rows of the matrix; and
   a periphery circuit configured to allow the logical data to be applied through the main portion of the source line to each of the plurality of branch portions of the source line,
   wherein the periphery circuit comprises:
      a multiplexer electrically connected to the at least four bit lines to select one of the at least four bit lines,
      a first switch electrically connected to the multiplexer to allow a ground voltage to be applied on the selected bit line in accordance with a first switching signal,
      a second switch electrically connected to the source line to allow the ground voltage to be applied on the source line in accordance with a second switching signal;
      a voltage source for providing a writing voltage, the voltage source having a first terminal and a second terminal, wherein the second terminal is grounded;
      a third switch electrically connected between the multiplexer and the first terminal of the voltage source to electrically connect the selected bit line to the voltage source in accordance with a third switching signal; and
      a fourth switch electrically connected between the source line and the first terminal of the voltage source to electrically connect the source line to the voltage source in accordance with a fourth switching signal.

2. The device of claim 1, wherein the main portion is electrically connected to the second switch, and the plurality of branch portions are electrically connected to the plurality of memory cells.

3. The device of claim 2, wherein the main portion is located between two of the at least four bit lines.

4. The device of claim 2, wherein the plurality of branch portions are parallel to the plurality of rows of the matrix, and the main portion is parallel to the plurality of columns of the matrix.

5. The device of claim 1, wherein the plurality of memory cells are resistive random-access memory (RRAM) cells.

6. The device of claim 5, wherein each of the plurality of memory cells comprises a MOS transistor and a resistive memory unit.

7. The device of claim 1, wherein the I/O memory block further comprises a plurality of word lines electrically connected to the plurality of memory cells.

8. A device, comprising:
a plurality of input/output (I/O) memory blocks, a gap being provided at one edge of each of the plurality of I/O memory blocks, each of the plurality of I/O memory blocks comprising:
   a plurality of memory cells arranged in a matrix of a plurality of rows and a plurality of columns;
   at least four bit lines electrically connected to the plurality of memory cells and configured to provide logical data to the plurality of memory cells; and
   a source line connected to the plurality of memory cells and configured to provide the logical data to the plurality of memory cells, the source line having a main portion located in the gap and a plurality of branch portions connected to the main portion, each of the plurality of branch portions being electrically connected to the memory cells in one of the plurality of rows of the matrix; and
a periphery circuit configured to allow the logical data to be applied through the main portion of the source line to each of the plurality of branch portions of the source line,
wherein the periphery circuit comprises:
   a multiplexer electrically connected to the at least four bit lines to select one of the at least four bit lines;
   a first switch electrically connected to the multiplexer to allow a ground voltage to be applied on the selected bit line in accordance with a first switching signal;
   a second switch electrically connected to the source line to allow the ground voltage to be applied on the source line in accordance with a second switching signal;
   a voltage source for providing a writing voltage to the selected bit line or the source line, the voltage source having a first terminal and a second terminal, wherein the second terminal is grounded;
   a third switch electrically connected between the multiplexer and the first terminal of the voltage source to electrically connect the selected bit line to the voltage source in accordance with a third switching signal; and
   a fourth switch electrically connected between the source line and the first terminal of the voltage source to electrically connect the source line to the voltage source in accordance with a fourth switching signal.

9. The device of claim 8, wherein the main portion is electrically connected to the second switch, and the plurality of branch portions are electrically connected to the plurality of memory cells.

10. The device of claim 9, wherein the plurality of branch portions are parallel to the plurality of rows of the matrix, and the main portion is parallel to the plurality of columns of the matrix.

11. The device of claim 8, wherein the plurality of memory cells are resistive random-access memory (RRAM) cells.

12. The device of claim 11, wherein each of the plurality of memory cells comprises a MOS transistor and a resistive memory unit.

13. The device of claim 8, wherein each of the plurality of I/O memory blocks further comprises a plurality of word lines electrically connected to the plurality of memory cells.

14. A method, comprising:
forming a plurality of memory cells of an input/output (I/O) memory block arranged in a matrix of a plurality of rows and a plurality of columns;
forming at least four bit lines to electrically connect the plurality of memory cells; and
forming a source line to electrically connect the plurality of memory cells of the I/O memory block together, the source line having:
   a main portion; and
   a plurality of branch portions connected to the main portion, each of the plurality of branch portions electrically connected to the memory cells in one of the plurality of rows of the matrix, wherein each of the plurality of branch portions of the source line is applied with logical data through the main portion of the source line; and
forming a periphery circuit configured to allow the logical data to be applied through the main portion of the source line to each of the plurality of branch portions of the source line,
wherein the periphery circuit comprises:
   a multiplexer electrically connected to the at least four bit lines to select one of the at least four bit lines;
   a first switch electrically connected to the multiplexer to allow a ground voltage to be applied on the selected bit line in accordance with a first switching signal;
   a second switch electrically connected to the source line to allow the ground voltage to be applied on the source line in accordance with a second switching signal;
   a voltage source for providing a writing voltage to the selected bit line or the source line, the voltage source having a first terminal and a second terminal, wherein the second terminal is grounded;
   a third switch electrically connected between the multiplexer and the first terminal of the voltage source to electrically connect the selected bit line to the voltage source in accordance with a third switching signal; and
   a fourth switch electrically connected between the source line and the first terminal of the voltage source to electrically connect the source line to the voltage source in accordance with a fourth switching signal.

15. The method of claim 14, wherein the plurality of branch portions are electrically connected to the plurality of memory cells and parallel to the plurality of rows of the matrix, and the main portion is parallel to the plurality of columns of the matrix.

16. The method of claim 14, further comprising forming a plurality of word lines electrically connected to the plurality of memory cells.

* * * * *